United States Patent
Imai et al.

(10) Patent No.: US 6,734,720 B2
(45) Date of Patent: May 11, 2004

(54) OPERATIONAL AMPLIFIER IN WHICH THE IDLE CURRENT OF ITS OUTPUT PUSH-PULL TRANSISTORS IS SUBSTANTIALLY ZERO

(75) Inventors: Hiroshi Imai, Kariya (JP); Takeshi Miki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/223,702

(22) Filed: Aug. 20, 2002

(65) Prior Publication Data

US 2003/0052737 A1 Mar. 20, 2003

(30) Foreign Application Priority Data

Aug. 20, 2001 (JP) ........................................ 2001-249500

(51) Int. Cl.[7] .................................................. H03F 3/45
(52) U.S. Cl. ......................... 327/560; 330/288; 330/255
(58) Field of Search .................................. 327/560, 561, 327/562, 563; 330/228, 283, 215, 255, 252

(56) References Cited

U.S. PATENT DOCUMENTS

| | | | | |
|---|---|---|---|---|
| 5,399,991 A | * | 3/1995 | Moraveji | 330/255 |
| 6,137,363 A | | 10/2000 | Miki et al. | 330/255 |
| 6,278,326 B1 | * | 8/2001 | Murray et al. | 330/288 |
| 6,380,808 B1 | | 4/2002 | Uasa et al. | 330/263 |

FOREIGN PATENT DOCUMENTS

| | | |
|---|---|---|
| JP | 7-298277 | 11/1995 |
| JP | 8-97645 | 4/1996 |
| JP | 8-307224 | 11/1996 |
| JP | 11-74742 | 3/1999 |
| JP | 11-308055 | 11/1999 |
| JP | 2000-252769 | 9/2000 |

* cited by examiner

Primary Examiner—Dinh T. Le
(74) Attorney, Agent, or Firm—Posz & Bethards, PLC

(57) ABSTRACT

A high slew rate operational amplifier circuit of which the through current of its push-pull transistors is substantially zero is disclosed. The operational amplifier circuit preferably comprises an amplifier portion and a push-pull output amplifier including NPN and PNP output transistors. The output of the amplifier portion is transferred to the NPN output transistors base through a PNP driving transistor and to the PNP output transistors base through an NPN driving transistor. The emitters of the driving transistors are connected to respective power supply conductors through respective current sources. The through current reduction is achieved by resistors inserted between the current sources and the corresponding power supply conductors, an NPN transistor so connected with the NPN output transistor as to constitute a current mirror and a PNP transistor so connected with the PNP output transistor as to constitute another current mirror.

2 Claims, 3 Drawing Sheets

OPERATIONAL AMPLIFIER IN WHICH THE IDLE CURRENT OF ITS OUTPUT PUSH-PULL TRANSISTORS IS SUBSTANTIALLY ZERO

BACKGROUND OF THE INVENTION

1. Field of the Invention

The invention relates to an operational amplifier with a push-pull output stage and more specifically to a high slew rate operational amplifier.

2. Description of the Related Art

FIG. 1 is a diagram showing a structure of a conventional operational amplifier to which the present invention relates. In FIG. 1, the operational amplifier 1 comprises a differential amplifier 10 for providing an amplified output Vio in response to the differential between input voltage V+ and V− and an output push-pull amplifier 20 for providing an output Vo in response to the intermediate output Vio from the amplifier 10. The output push-pull amplifier 20 includes a push-pull transistor stage comprising an NPN transistor T3 having its collector connected to a positive power supply conductor Vp, a PNP transistor T4 having its collector connected to a negative power supply conductor Vn, and serially coupled resistors R1 and R2 inserted between the emitters of the transistors T3 and T4 (hereinafter, referred to as "the push-pull transistors"). To the base of the push-pull first transistor T3, there are connected the cathode of a constant current source S1 having its anode connected to the positive power supply conductor Vp and the emitter of a PNP driving transistor T1 of which the collector is connected to the negative power supply conductor Vn. To the base of the push-pull second transistor T4, there are connected the anode of a constant current source S2 having its cathode connected to the negative power supply conductor Vn and the emitter of an NPN driving transistor T2 of which the collector is connected to the positive power supply conductor Vp. The bases of the driving transistors T1 and T2 are commonly connected to the output Vio of the amplifier circuit 10 and one end of a capacitor C, the other end of which is connected to the negative power supply conductor Vn.

In order to raise the slew rate of the output Vo, the push-pull amplifier is so configured that the push-pull transistors T3 and T4 are always in ON state and accordingly always pass a certain-level current, which we call "the through current". The present invention relates to operational amplifiers as shown in FIG. 1.

Such high slew rate operational amplifiers are used, for example, in electronic control units (ECUs) of an engine and various electronic devices mounted in an automobile. Since it is necessary to make ECUs smaller and lighter, it is necessary to integrate a circuit including one or more operational amplifiers and an output circuit for driving a load into a single chip IC (integrated circuit). The calorific volume of the IC on a chip is one of the factors that limit the size of the IC. For this reason, in order to increase the integration degree of an IC, it is preferable to reduce the calorific volume of an IC. Reducing the through current which flows through the push-pull transistors T3 and T4 is one of effective techniques we can use to suppress the calorific volume of an operational amplifier circuit.

It is an object of the invention to provide a high slew rate operational amplifier circuit that enables the through current of its push-pull transistors to be reduced substantially to zero.

It is another object of the invention to provide an IC including a high slew rate operational amplifier circuit that enables the through current of its push-pull transistors to be reduced substantially to zero.

SUMMARY OF THE INVENTION

According to the invention, a high slew rate operational amplifier circuit of which the through current of its push-pull transistors is substantially zero is provided. The invention is applicable to an operational amplifier circuit that comprises an amplifier portion for receiving a non-inverting input and an inverting input and providing an amplified output in response to the differential between the non-inverting input and the inverting input; and a push-pull amplifier for providing a final output in response to the amplified output. The push-pull amplifier preferably includes an NPN output transistor having its collector connected to a higher-potential conductor; a PNP output transistor having its collector connected to a lower-potential conductor; two serially connected resistors that are connected between emitters of the NPN and PNP output transistors, a node between the resistors serving as an output of the operational amplifier circuit, a PNP driving transistor having its base coupled with the amplified output and its emitter connected to a base of the NPN output transistor, a collector of the PNP driver transistor being connected to the lower-potential conductor; a first current source connected between the higher-potential conductor and an emitter of the PNP driving transistor; an NPN driving transistor having its base coupled with the amplified output and its emitter connected to a base of the PNP output transistor, a collector of the NPN driver transistor being connected to the higher-potential conductor; and a second current source connected between the lower-potential conductor and an emitter of the NPN driving transistor.

As circuit means for reducing a through current flowing through the NPN and PNP output transistors, the push-pull amplifier further comprises: a first resistor inserted between the higher-potential conductor and the first current source; a second resistor inserted between the second current source and the lower-potential conductor; an NPN transistor which is so connected with the NPN output transistor as to constitute a first current mirror and which has its emitter connected to a node between the second current source and the second resistor; and a PNP transistor which is so connected with the PNP output transistor as to constitute a second current mirror and which has its emitter connected to a node between the first resistor and the first current source.

BRIEF DESCRIPTION OF THE DRAWING

Further objects and advantages of the present invention will be apparent from the following description of the preferred embodiments of the invention as illustrated in the accompanying drawing, in which.

Throughout the drawing, the same elements when shown in more than one figure are designated by the same reference numerals.

DETAILED DESCRIPTION OF THE PREFERRED EMBODIMENTS

Figure 1:
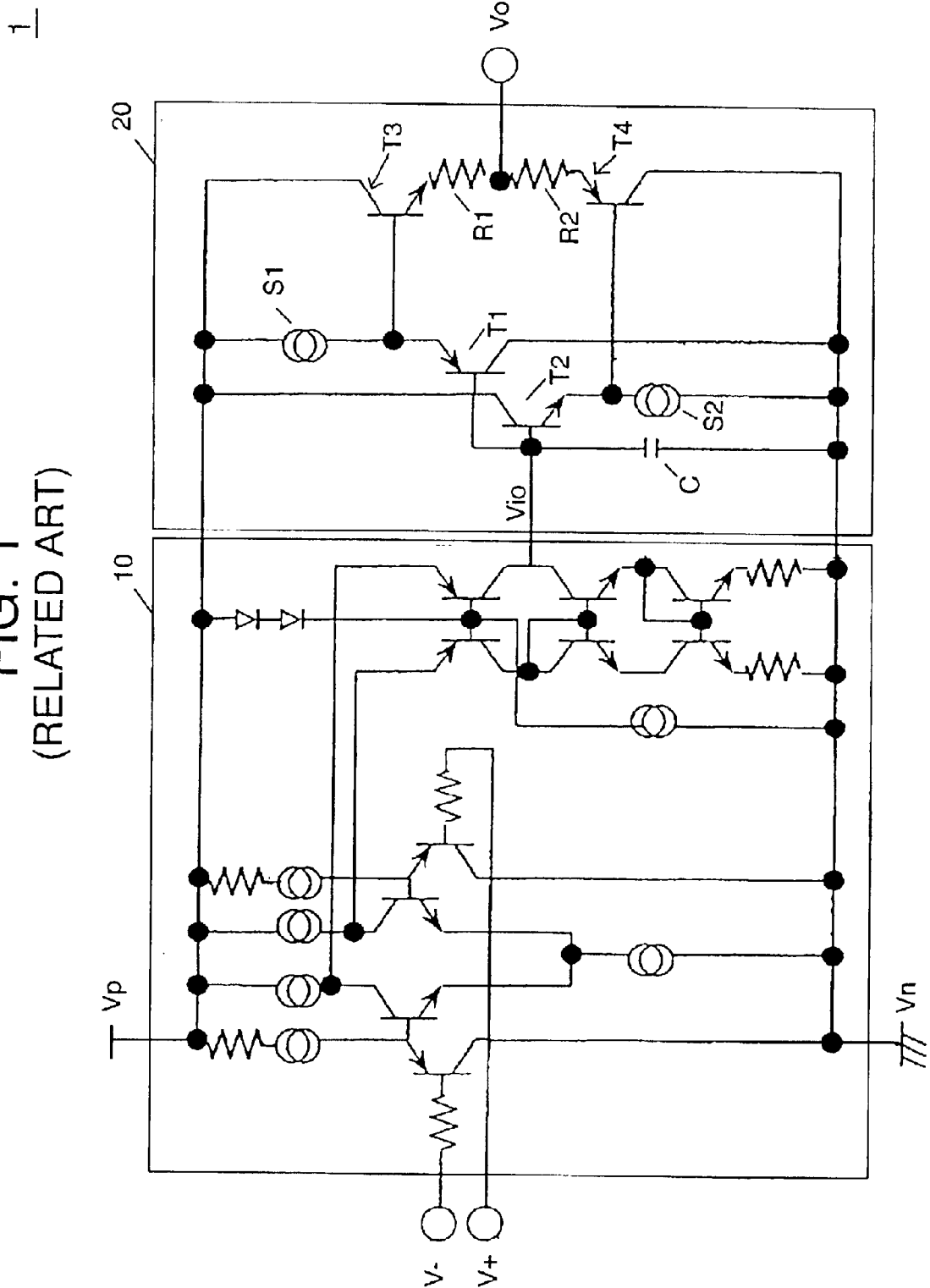
FIG. 1 is a circuit diagram showing a structure of a conventional operational amplifier to which the present invention relates.
Figure 2:
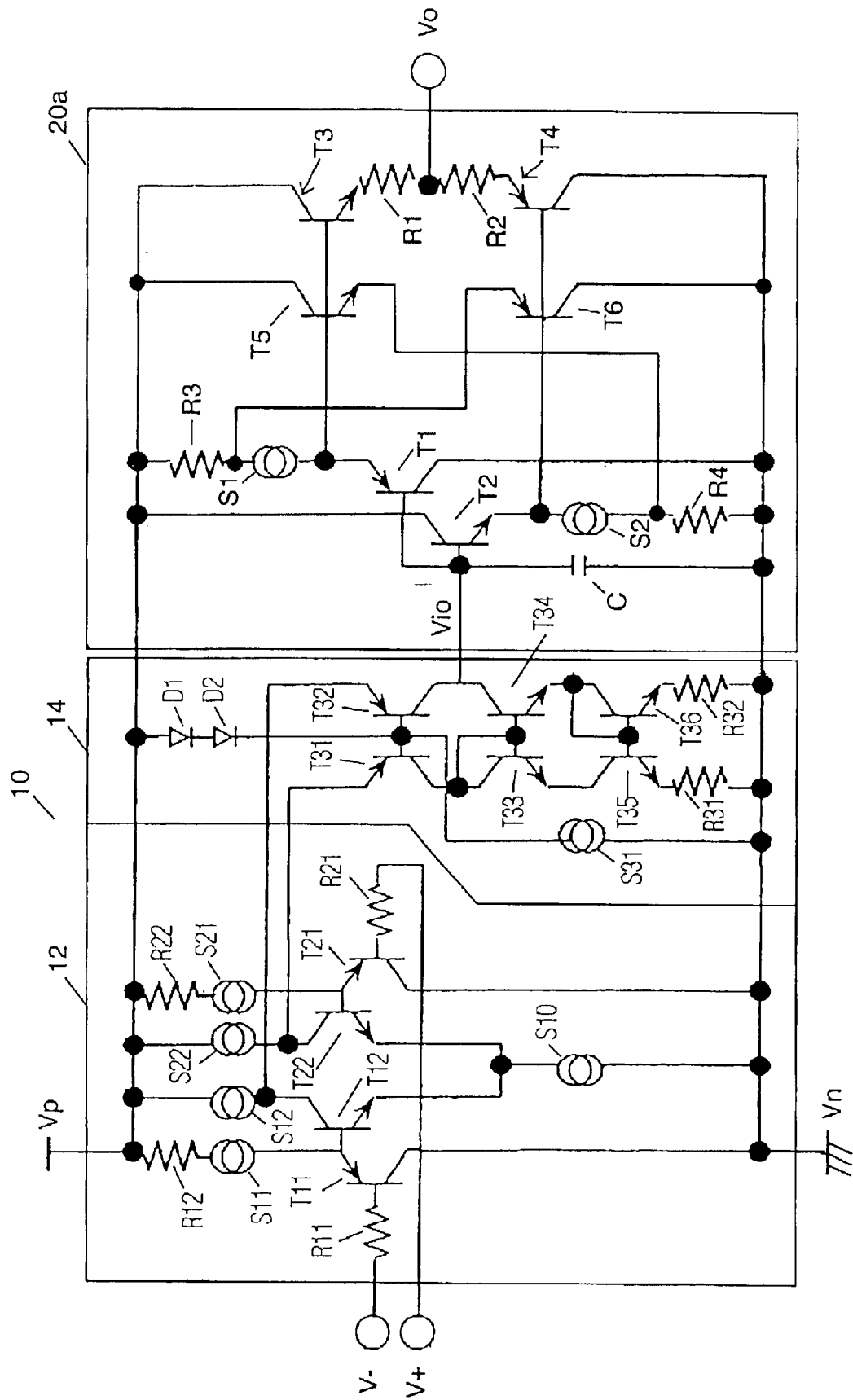
FIG. 2 is a schematic circuit diagram showing an exemplary structure of an operational amplifier according to an illustrative embodiment of the invention.

FIG. 2 is a schematic circuit diagram showing an exemplary structure of an operational amplifier according to an illustrative embodiment of the invention. In FIG. 2, the operational amplifier 2 is identical to that of FIG. 1 except that the push-pull output amplifier 20 has been replaced with a push-pull output amplifier 20a. Further, the pushpull output amplifier 20a is identical to the amplifier 20 except that the push-pull output amplifier 20a has been provided with a through current reduction circuit which comprises an NPN transistor T5, a PNP transistor T6 and resistors R3 and R4. The resistor R3 is inserted between the positive conductor Vp and the anode of the current source S1. The resistor R4 is inserted between the cathode of the current source S2 and the negative conductor Vn. The transistor T5 has its collector comuected to the positive conductor Vp, its emitter connected to the node between the current source S2 and the resistor R4, and its base connected to the node including the transistor T3 base. The transistor T6 has its collector connected to the negative conductor Vn, its emitter connected to the node between the current source S1 and the resistor R3, and its base connected to the node including the transistor T4 base.

It is noted that the electric potentials Vp and Vn may be set to any suitable values as long as the positive conductor Vp is higher in potential than the negative power supply conductor Vn. Therefore, "the positive conductor" should be taken as "a higher-potential conductor" and "the negative conductor" should be taken as "a lower-potential conductor". Either of the potentials Vp and Vn may be zero. Though the negative power supply terminal Vn is shown by using a well-known symbol indicative of the ground, the negative power supply voltage Vn has not to be 0 V.

The amplifier 10 may be any suitable amplifier that includes a differential amplifier.

Figure 3:
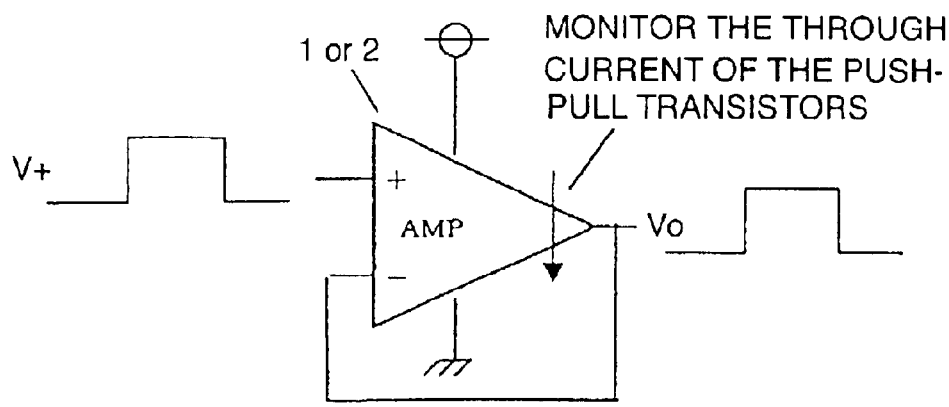
FIG. 3 is a diagram showing the wiring of an operational amplifier circuit that was used in simulations for comparing the through currents between the conventional operational amplifier of FIG. 1 and the inventive operational amplifier of FIG. 2.

Then, the operation of the operational amplifier 2 of FIG. 2 is described in the following. It is assumed that the operational amplifier 2 is operated, for example, in a non-inverting amplification configuration in which the output Vo terminal of the operational amplifier 2 is connected to the inverting input V−terminal and an input signal V+ is applied to the non-inverting input V+ terminal as shown in FIG. 3.

If the input voltage V+ goes higher from a certain voltage, then the driving transistor T1 turns on, causing the push-pull second transistor T4 to turn ON and keep ON till the output voltage Vo becomes equal to the input voltage V+of the non-inverting input terminal. Since the push-pull first transistor T3 is also in the ON state in this case, the entire current flowing through the second transistor T4 flows through the first transistor T3. The transistor T5 the base of which is connected to the base of the current flowing transistor T3 also turns ON, which cause a current to flow through the resistor R4. Since the transistors T3 and T5 have their collectors also connected together, the transistors T3 and T5 operate as a current mirror.

Since the resistor R4 is connected to the emitter of the transistor T2 through the current source S2, this reduces the current that flows through the transistor T2. This causes the base-emitter voltage of the transistor T1 to become smaller: i.e., the current of the transistor T1 becomes smaller, which reduces the base current of the transistor T3 and accordingly the current flowing through the transistor T4.

If the input voltage V+goes lower from a certain voltage, then the driving transistor T2 turns on, causing the push-pull first transistor T3 to turn ON and keep ON till the output voltage Vo becomes equal to the input voltage V+of the non-inverting input terminal. Since the push-pull first transistor T4 is also in the ON state in this case, the entire current flowing through the first transistor T3 flows through the second transistor T4. The transistor T6 the base of which is connected to the base of the current flowing transistor T4 also turns ON, which cause a current to flow through the resistor R3. Since the transistors T4 and T6 have their collectors also connected together, the transistors T4 and T6 operate as a current mirror.

Since the resistor R3 is connected-to the emitter of the transistor T1 through the current source S1, this reduces the current that flows through the transistor T1. This causes the base-emitter voltage of the transistor T2 to become smaller: i.e., the current of the transistor T2 becomes smaller, which reduces the base current of the transistor T4 and accordingly the current flowing through the transistor T3.

FIG. 3 is a diagram showing the wiring of an operational amplifier circuit that was used in simulations for comparing the through currents between the conventional operational amplifier of FIG. 1 and the inventive operational amplifier of FIG. 2. While the operational amplifier 2 is operated in the above-mentioned non-inverting amplification configuration for example, the through current that flows through the push-pull transistors T3 and T4 is monitored.

Figure 4:
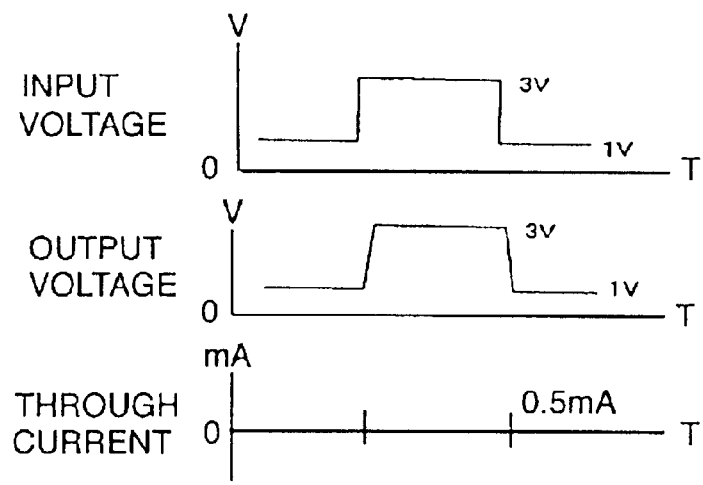
FIG. 4 is a diagram of graphs showing the result of the simulation of the inventive operational amplifier 2.
Figure 5:
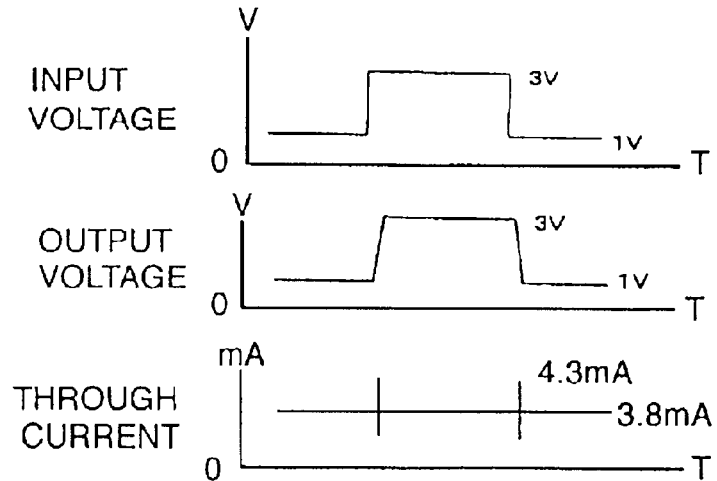
FIG. 5 is a diagram of graphs showing the result of the simulation of the conventional operational amplifier 1.

FIGS. 4 and 5 shows the result of the simulations in which a rectangular pulse of 3 V in the amplitude is applied to the non-inverting input terminal. In case of the inventive operational amplifier 2, the through current is almost always substantially 0 mA except at the leading edge and the trailing edge of the input pulse as shown in FIG. 4. On the other hand, in case of the conventional operational amplifier 1, the through current is almost always 3.8 mA as shown in FIG. 4.

Turning back to FIG. 2, in this specific example, the amplifier 10 comprises a conventional input amplifier 12 and a conventional differential amplifier 14 for example.

The input amplifier 12 includes a pair of amplifiers that shares a constant current source S10. The inverting input V−is applied to the base of a PNP transistor T11 through a resistor R11. The transistor T11 has its collector connected to the negative conductor Vn and its emitter connected to one end of a leg of serially connected constant current source S11 and resistor R12 and to the gate of the following NPN transistor T12. The other end of the leg is connected to the positive conductor Vp. The transistor T12 has its emitter connected to the anode of the common constant current source S10 and its collector connected to the cathode of a constant current source S12, the anode of which is connected to the positive conductor Vp. The transistor-T12 collector provides an amplified version of the inverting input V−.

Similarly, the non-inverting input V+is applied to the base of a PNP transistor T21 through a resistor R21. The transistor T21 has its collector connected to the negative conductor Vn and its emitter connected to one end of a leg of serially connected constant current source S21 and resistor R22 and to the gate of the following NPN transistor T22. The other end of the leg is connected to the positive conductor Vp. The transistor T22 has its emitter connected to the anode of the common constant current source S10 and its collector connected to the cathode of a constant current source S22, the anode of which is connected to the positive conductor Vp. The transistor T22 collector provides an amplified version of the non-inverting input V+.

The differential amplifier 14 comprises, for example, two diodes D1 and D2, two PNP transistors T31 and T32, four NPN transistors T33 through TT36 and two resistors R31 and R32. The emitters of the transistors T31 and T32 are connected to the collectors of the transistors T22 and T12 of the input amplifier 12, respectively. The bases of the transistors T31 and T32 are connected to each other and to the cathode end of serially connected diodes D1 and D2 and the anode of a constant current source S31, the cathode of which is connected to the negative conductor Vn. The anode end of the serially connected diodes D1 and D2 is connected to the positive conductor Vp. The collectors of the transistors T31 and T32 are connected to the collectors of the transistors T33 and T34, respectively. The transistors T33 and T34 have their bases connected to each other and to the collectors of the transistors T31 and T33 and their emitters connected to the collectors of the transistors T35 and T36, respectively. The bases of the transistors T35 and T36 are connected to each other and to the collector of the transistor T36. The emitters of the transistors T35 and T36 are connected to one ends of respective resistors R31 and R32, the other ends of which are connected to the negative conductor Vn. The collector node of the transistors T32 and T34 serves as output Vio of the differential amplifier 14.

Since the conventional input amplifier 12 and the conventional differential amplifier 14 operates in the well-known manner, the description of the operation of the amplifiers 12 and 14 is omitted.

The above-described operational amplifier 2 may be implemented as a discrete circuit or as a part of an integrated circuit. For example, Many widely different embodiments of the present invention may be constructed without departing from the spirit and scope of the present invention. It should be understood that the present invention is not limited to the specific embodiments described in the specification, except as defined in the appended claims.

What is claimed is:

1. An operational amplifier circuit comprising:
   an amplifier portion for receiving a non-inverting input and an inverting input and providing an amplified output in response to the differential between said non-inverting input and said inverting input; and
   a push-pull amplifier for providing a final output in response to said amplified output, said push-pull amplifier including:
      an NPN output transistor having its collector connected to a higher-potential conductor;
      a PNP output transistor having its collector connected to a lower-potential conductor;
      two serially connected resistors that are connected between emitters of said NPN and PNP output transistors, a node between said resistors serving as an output of the operational amplifier circuit;
      a PNP driving transistor having its base coupled with said amplified output and its emitter connected to a base of said NPN output transistor, a collector of said PNP driver transistor being connected to said lower-potential conductor;
      a first current source connected between said higher-potential conductor and an emitter of said PNP driving transistor;
      an NPN driving transistor having its base coupled with said amplified output and its emitter connected to a base of said PNP output transistor, a collector of said NPN driver transistor being connected to said higher-potential conductor;
      a second current source connected between said lower-potential conductor and an emitter of said NPN driving transistor; and
      a current reducing circuit for reducing a through current flowing through said NPN and PNP output transistors, wherein said current reducing circuit comprises;
         a first resistor inserted between said higher-potential conductor and said first current source;
         a second resistor inserted between said second current source and said lower-potential conductor;
         an NPN transistor which is so connected with said NPN output transistor as to constitute a first current mirror and which has its emitter connected to a node between said second current source and said second resistor; and
         a PNP transistor which is so connected with said PNP output transistor as to constitute a second current mirror and which has its emitter connected to a node between said first resistor and said first current source.

2. An integrated circuit including an operational amplifier circuit that comprises:
   an amplifier portion for receiving a non-inverting input and an inverting input and providing an amplified output in response to the differential between said non-inverting input and said inverting input; and
   a push-Dull amplifier for providing a final output in response to said amplified output, said push-pull amplifier including:
      an NPN output transistor having its collector connected to a higher-potential conductor;
      a PNP output transistor having its collector connected to a lower-potential conductor;
      two serially connected resistors that are connected between emitters of said NPN and PNP output transistors, a node between said resistors serving as an output of the operational amplifier circuit;
      a PNP driving transistor having its base coupled with said amplified output and its emitter connected to a base of said NPN output transistor, a collector of said PNP driver transistor being connected to said lower-potential conductor;
      a first current source connected between said higher-potential conductor and an emitter of said PNP driving transistor;
      an NPN driving transistor having its base coupled with said amplified output and its emitter connected to a base of said PNP output transistor, a collector of said NPN driver transistor being connected to said higher-potential conductor;
      a second current source connected between said lower-potential conductor and an emitter of said NPN driving transistor; and
      a current reducing circuit for reducing a through current flowing through said NPN and PNP output transistors, wherein said current reducing circuit comprises:
         a first resistor inserted between said higher-potential conductor and said first current source;
         a second, resistor inserted between said second current source and said lower-potential conductor;
         an NPN transistor which is so connected with said NPN output transistor as to constitute a first current mirror and which has its emitter connected to a node between said second current source and said second resistor; and
         a PNP transistor which is so connected with said PNP output transistor as to constitute a second current mirror and which has its emitter connected to a node between said first resistor and said first current source.

* * * * *